(12) United States Patent
Harari et al.

(10) Patent No.: US 11,610,909 B2
(45) Date of Patent: Mar. 21, 2023

(54) PROCESSES FOR FORMING 3-DIMENSIONAL HORIZONTAL NOR MEMORY ARRAYS

(71) Applicant: Sunrise Memory Corporation, Fremont, CA (US)

(72) Inventors: Eli Harari, Saratoga, CA (US); Wu-Yi Henry Chien, San Jose, CA (US)

(73) Assignee: SUNRISE MEMORY CORPORATION, San Jose, CA (US)

(*) Notice: Subject to any disclaimer, the term of this patent is extended or adjusted under 35 U.S.C. 154(b) by 108 days.

(21) Appl. No.: 16/875,460

(22) Filed: May 15, 2020

(65) Prior Publication Data

US 2020/0365609 A1 Nov. 19, 2020

Related U.S. Application Data

(60) Provisional application No. 62/849,770, filed on May 17, 2019.

(51) Int. Cl.
| | | |
|---|---|---|
| *H01L 27/11556* | (2017.01) | |
| *G11C 5/06* | (2006.01) | |
| *G11C 5/02* | (2006.01) | |
| *H01L 27/11582* | (2017.01) | |

(52) U.S. Cl.
CPC ........ *H01L 27/11556* (2013.01); *G11C 5/025* (2013.01); *G11C 5/06* (2013.01); *H01L 27/11582* (2013.01)

(58) Field of Classification Search
CPC ......... H01L 27/11556; H01L 27/11582; H01L 29/40117; H01L 27/11551; H01L 27/11578; H01L 29/40114; G11C 5/025; G11C 5/06; G11C 8/14
See application file for complete search history.

(56) References Cited

U.S. PATENT DOCUMENTS

| | | | |
|---|---|---|---|
| 9,406,693 B1 | 8/2016 | Pang et al. | |
| 10,115,732 B2 | 10/2018 | Yu et al. | |
| 10,622,377 B2* | 4/2020 | Harari | ............... H01L 21/76843 |
| 2017/0092370 A1 | 3/2017 | Harari | |
| 2017/0148517 A1 | 5/2017 | Harari | |

OTHER PUBLICATIONS

"PCT Search Report and Written Opinion, PCT/US2020/033180", dated Aug. 12, 2020, 13 pages.

* cited by examiner

*Primary Examiner* — Cuong B Nguyen
(74) *Attorney, Agent, or Firm* — Edward C. Kwok; VLP Law Group LLP

(57) ABSTRACT

A process forms thin-film storage transistors (e.g., HNOR devices) with improved channel regions by conformally depositing a thin channel layer in a cavity bordering a source region and a drain region, such that a portion of the channel material abuts by junction contact the source region and another portion of the channel layer abut by junction contact the drain region. The cavity is also bordered by a storage layer. In one form of the process, the channel region is formed before the storage layer is formed. In another form of the storage layer is formed before the channel region is formed.

31 Claims, 10 Drawing Sheets

PROCESSES FOR FORMING 3-DIMENSIONAL HORIZONTAL NOR MEMORY ARRAYS

CROSS REFERENCE TO RELATED APPLICATIONS

The present invention is related to and claims priority of U.S. provisional application ("Provisional Application"), Ser. No. 62/849,770, entitled "Processes for Forming 3-dimensional Horizontal NOR Memory Arrays," filed on May 17, 2019.

The present application is also related to (i) U.S. patent application ("Non-provisional application I"), Ser. No. 16/107,118, entitled "Capacitive-coupled Non-volatile Thin-film Transistor Strings in Three-Dimensional Arrays," filed Aug. 21, 2018 and published as U.S. Patent Application Publication 2019/0006014; (ii) U.S. patent application ("Non-provisional application II"), Ser. No. 16/012,731, entitled "3-Dimensional NOR Memory Array Architecture and Methods for Fabrication Thereof," filed Jun. 19, 2018; and (iii) U.S. patent application ("Non-provisional application III"), Ser. No. 16/230,981, entitled "3-Dimensional NOR Memory Array with Very Fine Pitch Device and Method," filed on Dec. 21, 2018.

The disclosures of Non-provisional Applications I-III (collectively, the "Non-provisional Applications") and the Provisional Application are thereby incorporated by reference in their entireties.

BACKGROUND OF THE INVENTION

1. Field of the Invention

The present invention relates to manufacturing processes for integrated circuits. In particular, the present invention relates to manufacturing processes for forming 3-dimensional horizontal NOR-type memory strings.

2. Description of the Related Art

The Non-provisional Applications disclose processes for forming thin-film storage transistors organized as NOR memory strings ("HNOR devices") that are formed along active horizontal semiconductor strips.[1] According to the teachings in the Non-provisional Applications, the HNOR devices may be used either as non-volatile memory ("NVM") devices or as quasi-volatile memory ("QVM") devices.

[1] In this detailed description, with respect to structures formed above a planar semiconductor substrate, the terms "horizontal" and "vertical" refer to directions relative to a surface of the planar semiconductor substrate.

Non-provisional application I discloses, in FIGS. 5c-5e and the accompanying description of paragraphs [0142]-[0150] (as published in the '014 publication), forming a channel region of an HNOR device by replacing a sacrificial material, SAC-1, with a lightly-doped silicon or polysilicon material.

SUMMARY

The present invention provides processes that form thin-film storage transistors (e.g., HNOR devices) with improved channel regions. According to some embodiments of the present invention, such a process may include: (1) forming a plurality of active stacks of semiconductor material over a planar surface of a semiconductor substrate, the active stacks being spaced apart from each other along a first direction substantially parallel to the planar surface, wherein each active stack (i) extends lengthwise along a second direction that is substantially parallel to the planar surface and substantially orthogonal to the first direction, and (ii) comprises one or more active strips, and wherein each active strip (i) also extends lengthwise along the second direction, and (ii) comprises: (a) first and second semiconductor layers of a first conductivity; and (b) a sacrificial layer between the first and second semiconductor layers; (2) providing a protective layer over the active stacks; (3) forming a plurality of shafts through the protective layer, each shaft being provided between adjacent active stacks and exposing a sidewall of each active strip of at least one of the adjacent active stacks; (4) providing an etchant to selectively remove the sacrificial layer from each active strip, proceeding from the exposed sidewall of the active strip until the sacrificial layer of the active strip is substantially removed, thereby resulting in a cavity in place of the sacrificial layer; (5) conformally depositing a third semiconductor layer, the third semiconductor layer being of a second conductivity type opposite the first conductivity type, such that first portion and a second portion of the third semiconductor layer abut the first and second semiconductor layers, respectively; and (6) subjecting the first, second and third semiconductor layers of each active strip to a temperature that allows dopants in the first and second semiconductor layers to diffuse into the first and second portions of the semiconductor layer of the active strip sufficiently to change the first and second portions of the third semiconductor layer from the second conductivity type to the first conductivity type.

According to one embodiment of the present invention ("charge-trapping layer-first processes"), a process may further include prior to providing the protective layer, forming (i) a charge-trapping multi-layer over the sidewalls of active stacks, and (ii) local word lines each provided between adjacent active stacks, each word line abutting the charge-trapping multi-layers of the adjacent active stacks. Forming the charge-trapping multi-layer includes forming (i) a tunneling dielectric layer; (ii) a charge-trapping layer; and (iii) a blocking dielectric layer. Forming the tunnel dielectric layer may include (i) depositing a silicon nitride layer over the sidewalls of each active stack; and (ii) partially oxidizing the silicon nitride layer such that a portion of silicon nitride layer becomes a silicon oxynitride layer. Any unoxidized portions of the silicon nitride layer may be removed or left intact.

According to another embodiment of the present invention ("channel-first processes"), a process may include, subsequent to conformally depositing the third semiconductor layer, (a) removing the protective layer, and (b) forming (i) a charge-trapping multi-layer over the sidewalls of active stacks, and (ii) local word lines each provided between adjacent active stacks, each word line abutting the charge-trapping multi-layers of the adjacent active stacks. Forming the charge-trapping multi-layer comprises forming (i) a tunneling dielectric layer; (ii) a charge-trapping layer; and (iii) a blocking dielectric layer. In channel-first processes providing the protective layer may include (a) depositing conformal silicon nitride layers over the sidewalls of the active stacks, and (b) depositing a polysilicon layer, such that the subsequent conformal deposition of the third semiconductor layer results in a third portion and a fourth portion of the third semiconductor layer abutting the conformal silicon nitride layers on opposite sidewalls of the active stack.

In the processes of the present invention, each local word line, the charge-storing multi-layer abutting the word line, the third or fourth portion of the third semiconductor layer abutting the tunnel dielectric layer of that charge-storing multi-layer and the third and fourth semiconductor layers form, respectively, a gate electrode, a storage layer, a channel region and source and drain regions of a thin-film storage transistor. Adjacent thin-film storage transistors along one side of an active strip form a NOR-type memory string. In one embodiment, a thin-film storage transistor of the present invention has the channel region depleted when the word line is biased to 0 volts. The charge-trapping component layer of the storage layer may include a material selected from one or more of silicon-rich silicon nitride, nano-crystals of silicon, germanium and a nanodot material embedded silicon nitride or silicon oxide. With QVM applications in mind, the tunnel dielectric layer may be 0.0-4.0 nm thick. Alternatively, with NVM applications in mind, the tunnel dielectric layer may be 4.0-7.0 nm thick. Dopants in the source and drain regions of the thin-film storage transistor may be any of phosphorus, arsenic, antimony and bismuth, or any combination of these dopants.

The present invention provides, in a thin-film storage transistor, such as a HNOR device, robust electrical contacts between a channel region and abutting source and drain regions. These robust contacts improve both the forward current in the HNOR device and uniformity across HNOR devices in active strips in an active stack. Such uniformity advantage may be achieved among all HNOR devices formed on the same semiconductor die or wafer.

In one embodiment, the present invention provides an air gap between the channel regions of adjacent HNOR devices located on opposite sides of an active strip. This air gap reduces disturb (i.e., electrical interference) between adjacent thin-film storage transistors along an active strip.

In one embodiment, the channel region of a thin-film storage transistor of the present invention is formed after formations of the source and drain layers and the charge-trapping layers, so that thermal steps that may cause adverse effects of dopant diffusion into the channel region from the adjacent heavily-doped source and drain regions may be carried out prior to channel region formation.

The present invention is better understood upon consideration of the detailed description below in conjunction with the accompanying drawings.

DETAILED DESCRIPTION OF THE PREFERRED EMBODIMENTS

In this detailed description, process steps described for one embodiment of the present invention may be used in other embodiments, even when such process steps are not expressly described to be used in conjunction with such other embodiments. Unless otherwise stated expressly, when a method is described herein as having two or more defined steps, the defined steps can be carried out in any order or simultaneously, and the method may also include one or more other steps carried out before any of the defined steps, between any two of the defined steps, or after any number of the defined steps are carried out.

Figure 1:
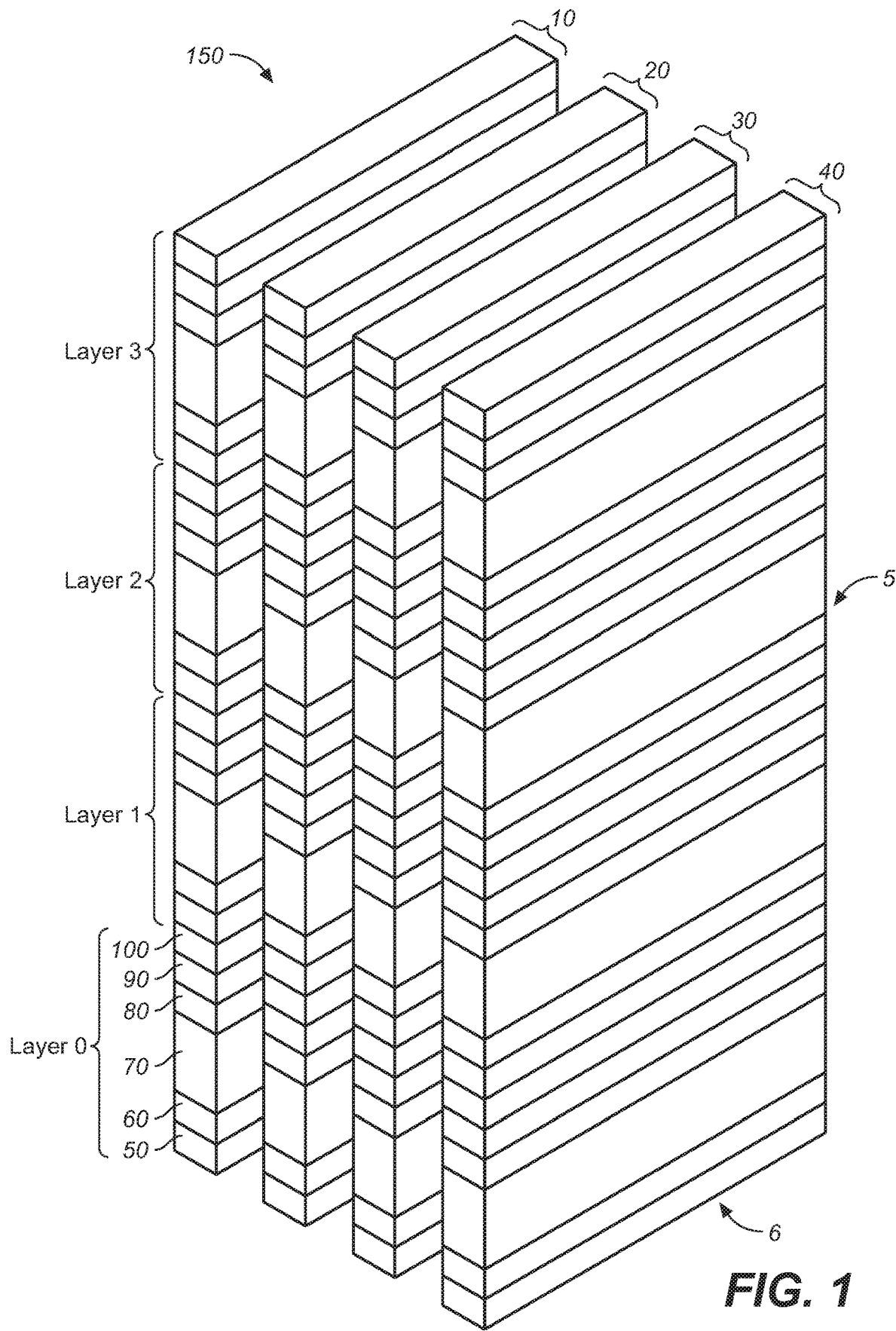
FIG. 1 shows, in an intermediate step of HNOR device formation, semiconductor structure 150 including exemplary active stacks 10, 20, 30 and 40 that are formed above semiconductor substrate 6, each active stack including four exemplary active strips or layers 0-3 of HNOR devices.

FIG. 1 shows, in an intermediate step of HNOR device formation, semiconductor structure 150 including exemplary active stacks 10, 20, 30 and 40 that are formed above semiconductor substrate 6, each active stack including four exemplary active strips (or layers) 0-3 of HNOR devices. Although FIG. 1 shows only four active strips of HNOR devices in each of four active stacks, the number of active strips and the number of active slacks are merely provided for example only; any number of active stacks and any number of active strips (e.g., 1, 2, 4, 8, 12, 16 or more) may be provided. Support circuitry for HNOR device operations (not shown) may be formed in or on the semiconductor substrate. Such circuitry may include, for example, decoders, sense amplifiers, voltage sources and control logic circuits. The circuitry may be electrically connected to the HNOR devices by conductor-filled vias, buried contacts, interconnection conductor layers or any suitable method. Active stacks 10, 20, 30 and 40 are separated from each other by a predetermined distance; bracing (not shown) may be provided to ensure structural integrity.

As shown in FIG. 1, active strips 0-3 each include (i) dielectric layer 100, (ii) source layer 80, with metal strapping layer 90, (iii) sacrificial material (SAC-1) layer 70, and (iv) drain layer 60, with metal strapping layer 50. SAC-1 may be, for example, a silicon oxide (e.g., $SiO_2$). Dielectric layer 100 electrically isolates adjacent active strips in the active stack from each other. Metal strapping layers 50 and 90 may be formed using a replacement process disclosed in Non-provisional application II. In the examples of this detailed description, source layer 80 and drain layer 60 are $n^+$-doped (e.g., doped with phosphorus, arsenic, antimony, bismuth or any combination of these dopants), with dopant concentration, for example, exceeding $1.0 \times 10^{20}$ $cm^{-3}$.

Figure 2:
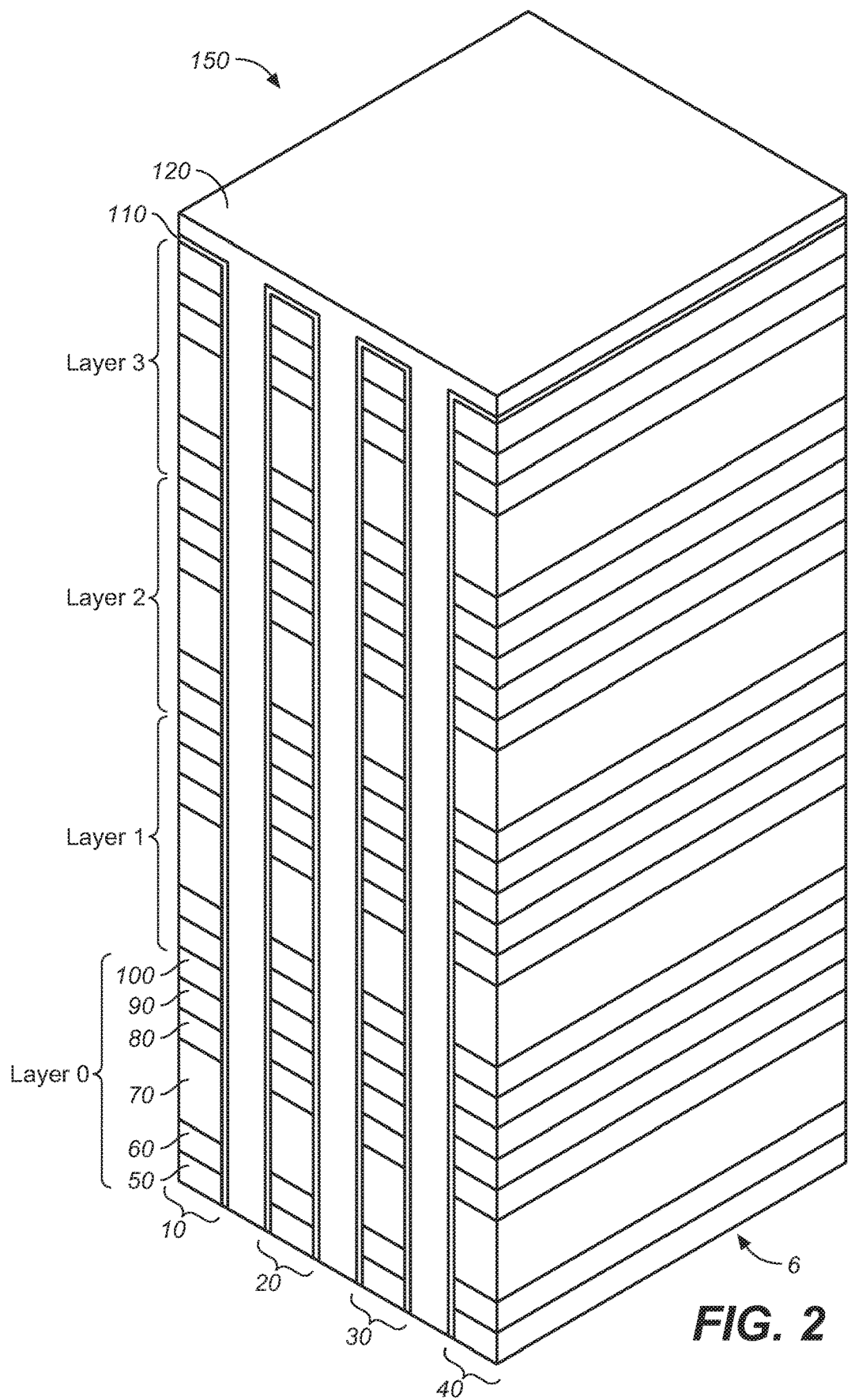
FIG. 2 shows semiconductor structure 150 of FIG. 1, after thin silicon nitride (SiN) layer 110 and second sacrificial material layer (SAC-2) 120 are deposited using, for example, low-pressure chemical vapor deposition (LPCVD) steps.

FIG. 2 shows semiconductor structure 150 of FIG. 1, after thin layer 110 of silicon nitride (SiN) and second sacrificial material (SAC-2) layer 120 are deposited using, for example, low-pressure chemical vapor deposition (LPCVD) steps. SiN layer 110 coats the sidewalls and top surfaces of active stacks 10, 20, 30 and 40. SAC-2 layer 120—which may be thicker than SiN layer 110 and may be formed out of polysilicon or germanium—fills the trenches between adjacent active stacks.

Figure 3:
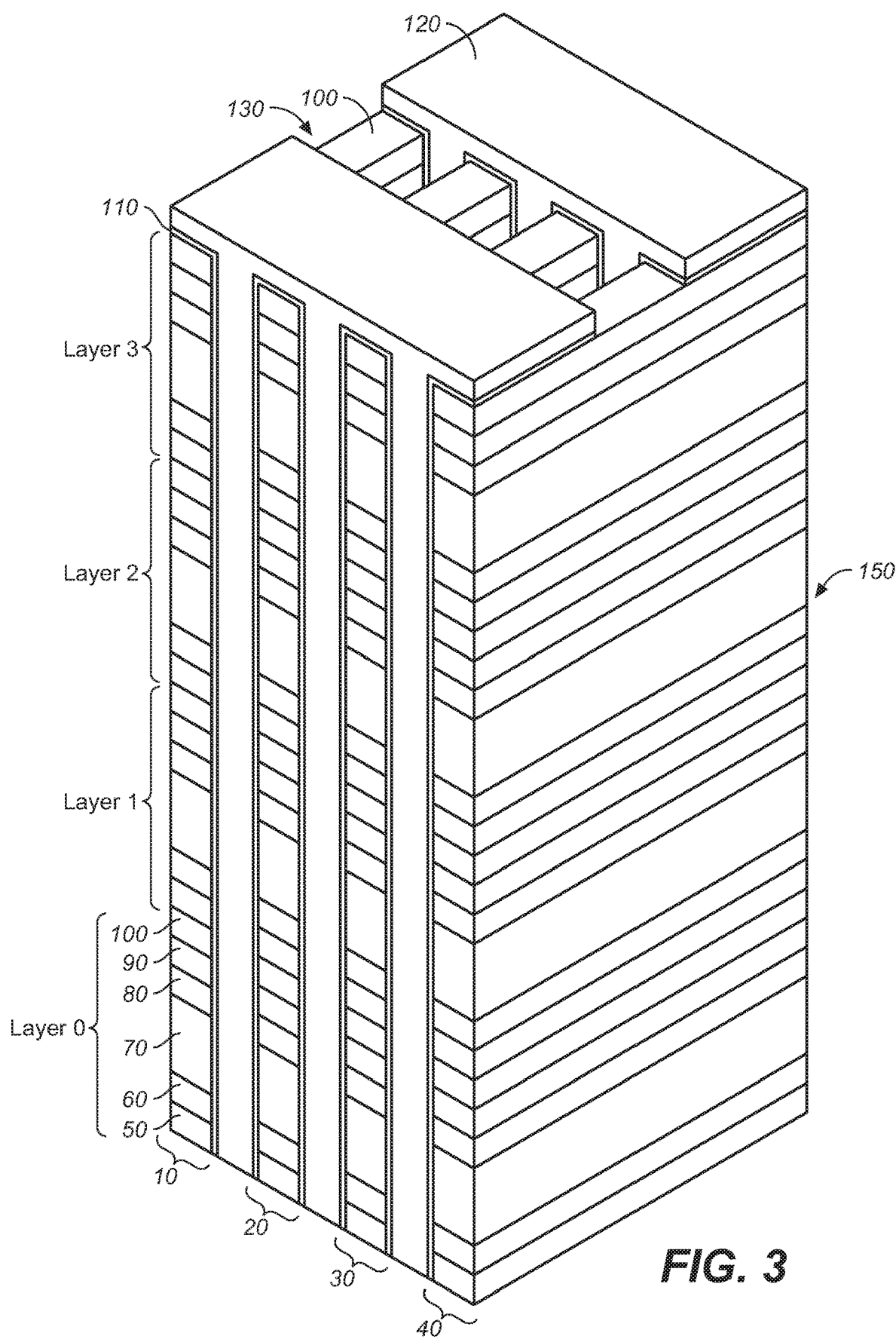
FIG. 3 shows semiconductor structure 150 of FIG. 2, after being patterned using photo-lithographical techniques to anisotropically remove a portion of SAC-2 layer 120 and an underlying portion of SiN layer 110, so as to form a row of vertical shafts 130, each shaft being provided between adjacent active stacks and reaching a depth at or below active strip 0 of each active stack.

Thereafter, as shown in FIG. 3, semiconductor structure 150 is patterned using photo-lithographical techniques to anisotropically remove both a portion of SAC-2 layer 120 and an underlying portion of SiN layer 110, so as form row 130 of vertical shafts, each shaft in row 130 being provided between adjacent active stacks, with each shaft reaching a depth at or below the bottom of active strip 0 in each active stack. After anisotropical removal of SAC-2 layer 120, the underlying SiN layer 110 may be removed using, for example, hot phosphoric acid. Residues may be removed from the shafts of row 130 by a brief isotropic etch. Each shaft exposes a vertical portion of the sidewalls of each active strip in each active stack. Although FIG. 3 shows only a single row of shafts for active stacks 10, 20, 30 and 40, more than one such row of shafts may be formed, with each row of shafts being spaced apart from an adjacent row by a predetermined distance along the length of the active stacks.

Figure 4:
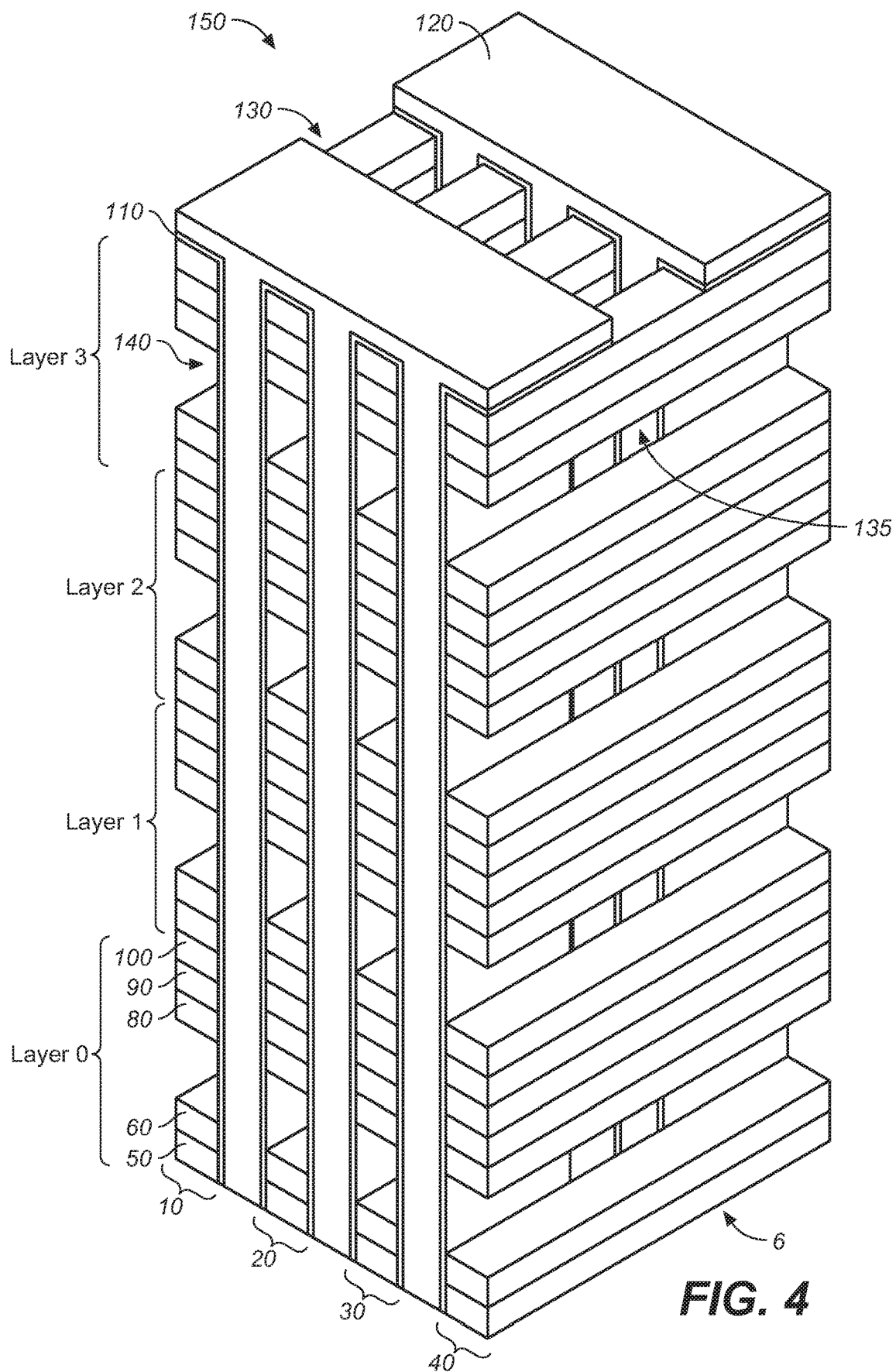
FIG. 4 shows semiconductor structure 150 of FIG. 3, after removal of SAC-1 layer 70 by an isotropic hydrofluoric acid (HF) etch.

FIG. 4 shows semiconductor structure 150 of FIG. 3, after removal of SAC-1 layer 70 by an isotropic hydrofluoric acid (HF) etch. The HF etch—which is highly selective—has a higher etch rate on SAC-1 layer 70 than on any other layers of an active strip. The HF etchant first creates opening 135 at the portion of the sidewall of SAC-1 layer 70 of each active strip exposed by a shaft, and proceeds from opening 135 in both directions along the length of the active strip to remove the remainder of SAC-1 layer 70. FIG. 4 shows semiconductor 150, after the removal of SAC-1 layer 70 by the HF etch, resulting in air-filled cavity or tunnel 140 in place of the removed SAC-1 material.

Figure 5:
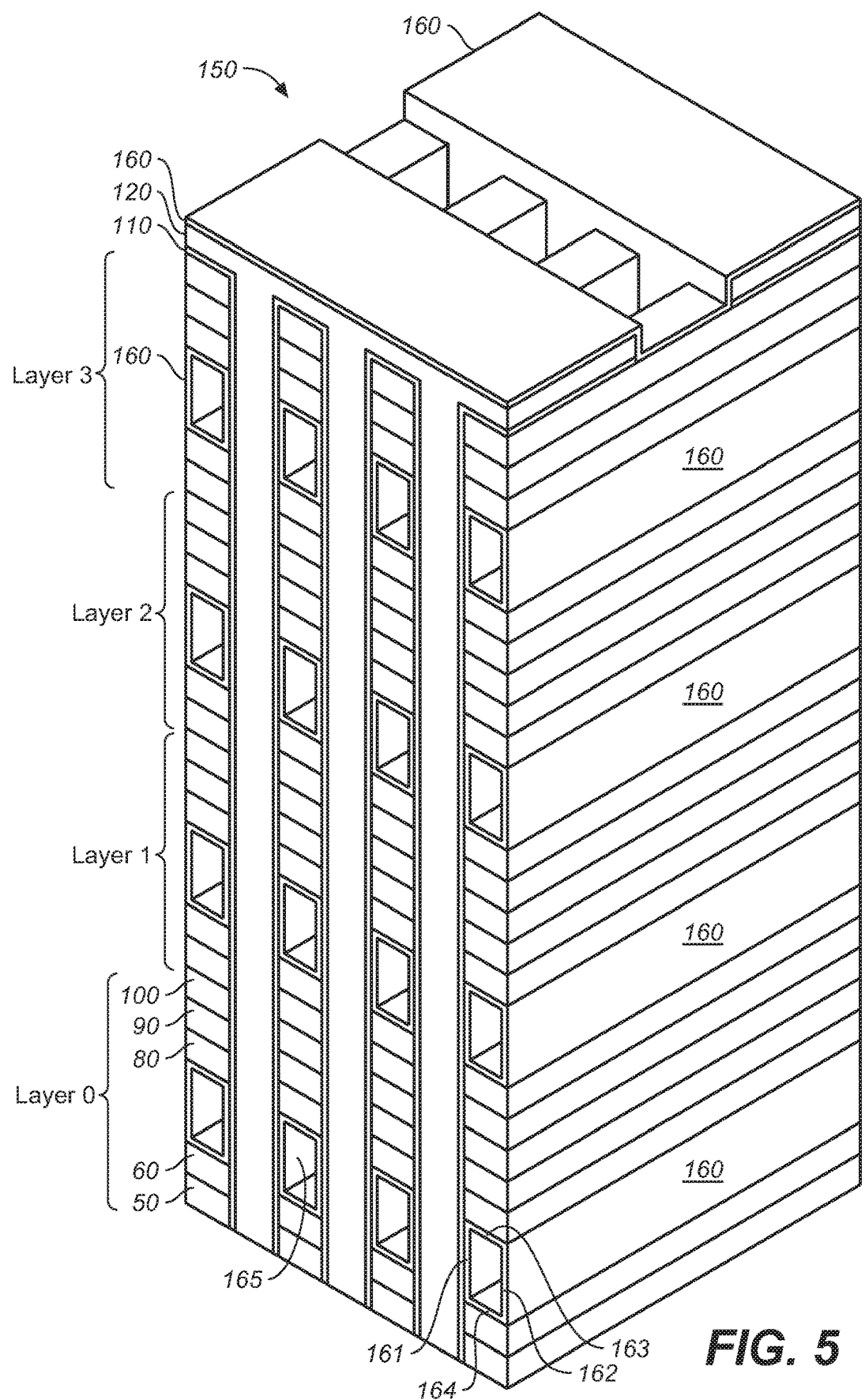
FIG. 5 shows semiconductor structure 150 of FIG. 4, after deposition of thin in-situ p-doped silicon layer 160.

FIG. 5 shows semiconductor structure 150 of FIG. 4, after deposition of thin in-situ p-doped silicon layer 160 (e.g., 3.0-20.0 nm thick) using, for example, LPCVD techniques at a relatively low temperature (e.g., around 550° C.). Resulting p-doped silicon layer 160 has good step-coverage and good thickness uniformity. To achieve a smooth surface, p-doped silicon layer 160 may be first deposited as amorphous silicon and subsequently re-crystallized at a higher temperature. Alternatively, p-doped silicon layer 160 may be deposited as polycrystalline silicon at a higher temperature. P-doped silicon 160 coats the sidewalls of all features conformally, forming walls 161, 162, 163 and 164 that enclose cavity 165 (i.e., diminished cavity 140) along the length of each active strip (i.e., p-doped silicon layer 160 forms a macaroni-shape tube in each actives strip).

As shown in FIG. 5, walls 161 and 162 along opposite lateral sides of each active strip make junction contacts with adjacent source layer 80 and drain layer 60 of the active strip at areas along their shorter extents. Top and bottom walls 163 and 164 of p-doped silicon layer 160 are in intimate contact with source layer 80 and drain layer 60 layers, respectively, at areas along their longer extents. Consequently, walls 163 and 164 become n+-doped by a subsequent thermal annealing step, when the n+ dopants in source layer 80 and drain layer 60 diffuse into walls 163 and 164 over the areas of contact. However, of importance, walls 161 and 162—which contact source layer 60 and drain layer 60 at areas along their shorter extents—are volumetrically constrained to remain p-doped after recrystallization. This is because thermal diffusion of the n+ type dopants (e.g., arsenic or antimony) in the thin recrystallized p-doped channel regions (i.e., walls 161 and 162) is much slower, perhaps orders of magnitude slower, than the thermal diffusion of n+ dopants in bulk polycrystalline silicon of walls 163 and 164. Consequently, the p-doped channel regions of walls 161 and 162 avoid transistor source-drain punch-through even in relatively short thin channels (e.g., 100.0 nm or less channel length and 30.0 nm or less channel thickness). Cavity 165 may be left as air-filled (i.e., an air gap) or may be partially filled by deposition of a dielectric material through opening 135 of each active strip. A suitable dielectric material may be, for example, silicon oxide (not shown). Whether left air-filled or partially-filled by a deposited dielectric material, dielectric isolation is provided in cavity 165 between p-doped channel regions 161 and 162 on opposite lateral sides of the active strip.

Figure 6:
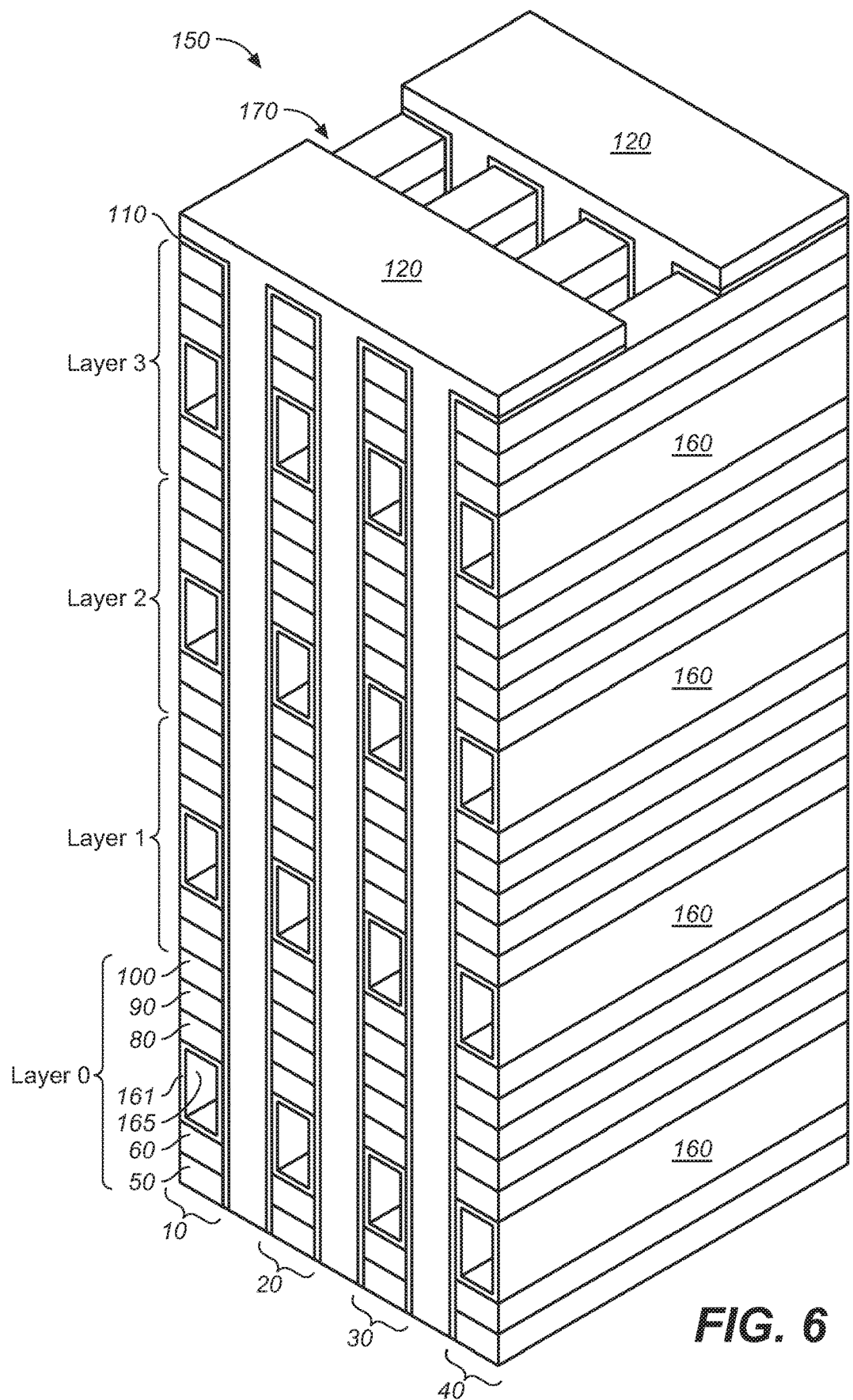
FIG. 6 shows semiconductor structure 150 of FIG. 5, after removing both p-doped silicon layer 160 and the thin deposited dielectric layer from exposed surfaces outside of cavity 165 (i.e., the areas indicated by reference numeral 170 and in shafts 130) by anisotropic or sideways etch.

FIG. 6 shows semiconductor structure 150 of FIG. 5, after removing both p-doped silicon layer 160 and the thin deposited dielectric layer from exposed surfaces outside of cavity 165 (i.e., the areas indicated by reference numeral 170 and in shafts 130) by anisotropic or sideways etch. A short isotropic etch may be used to further clear any residues of p-doped silicon from the vertical sidewalls of the shafts (e.g., row 130). Care must be taken, however, to ensure that the p-doped silicon inside cavity 165 of each active strip remains substantially intact beyond a few nanometers from opening 135.

Figure 7:
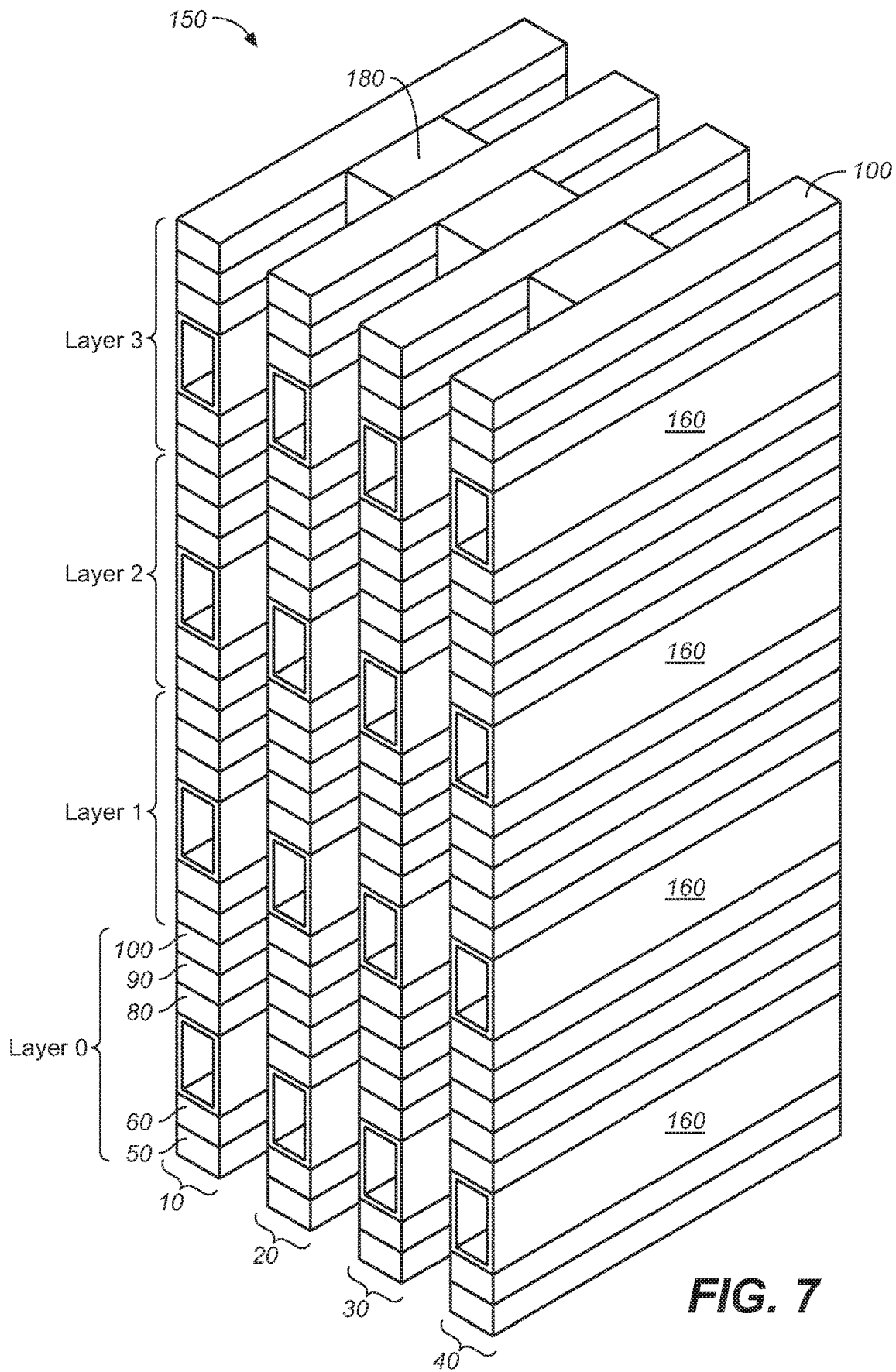
FIG. 7 shows semiconductor structure 150 of FIG. 6, after deposition of silicon oxide (e.g., $SiO_2$) into shafts 130 (not shown) and after removal of both SAC-2 layer 120 and SiN layer 110.

FIG. 7 shows semiconductor structure 150 of FIG. 6, after deposition of silicon oxide (e.g., $SiO_2$) into the shafts of row 130 (not shown) and after removal of both SAC-2 layer 120 and SiN layer 110. After deposition into the shafts of row 130, the silicon oxide may be planarized using either an etch-back technique or a chemical-mechanical polishing (CMP) technique. The resulting silicon oxide forms silicon oxide braces 180 that provide mechanical stability to the long active strips in tall multi-layer active stacks 10, 20, 30 and 40. Sacrificial layer 120 and SiN layer 110 may then be removed by a selective etch.

Figure 8A:
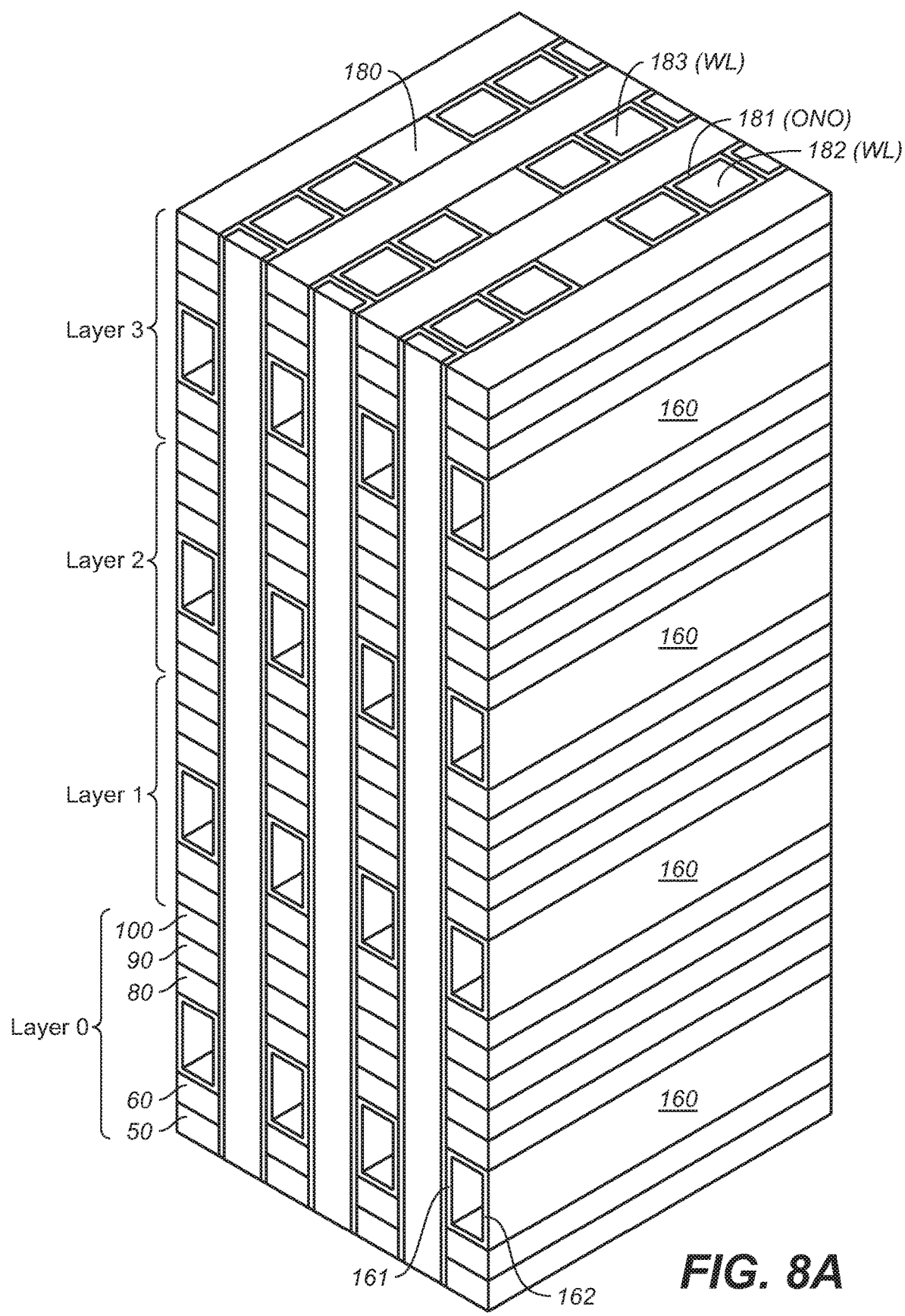
FIG. 8A shows semiconductor structure 150, after deposition of charge-trapping layer 181 and formation of vertical local word lines 182 and 183 on opposite sides of each active stack.

FIG. 8A shows semiconductor structure 150, after deposition of charge-trapping layer 181 and formation of vertical local word lines 182 and 183 on opposite sides of each active stack. Deposition of charge-trapping layer 181 (e.g., an oxide-nitride-oxide (ONO) tri-layer) and formation of local word lines 181 and 182 may follow the fabrication methods disclosed in Non-provisional Application III, incorporated by reference above. The local word lines may be formed out of a conductive material, such as polysilicon.

Figure 8B:
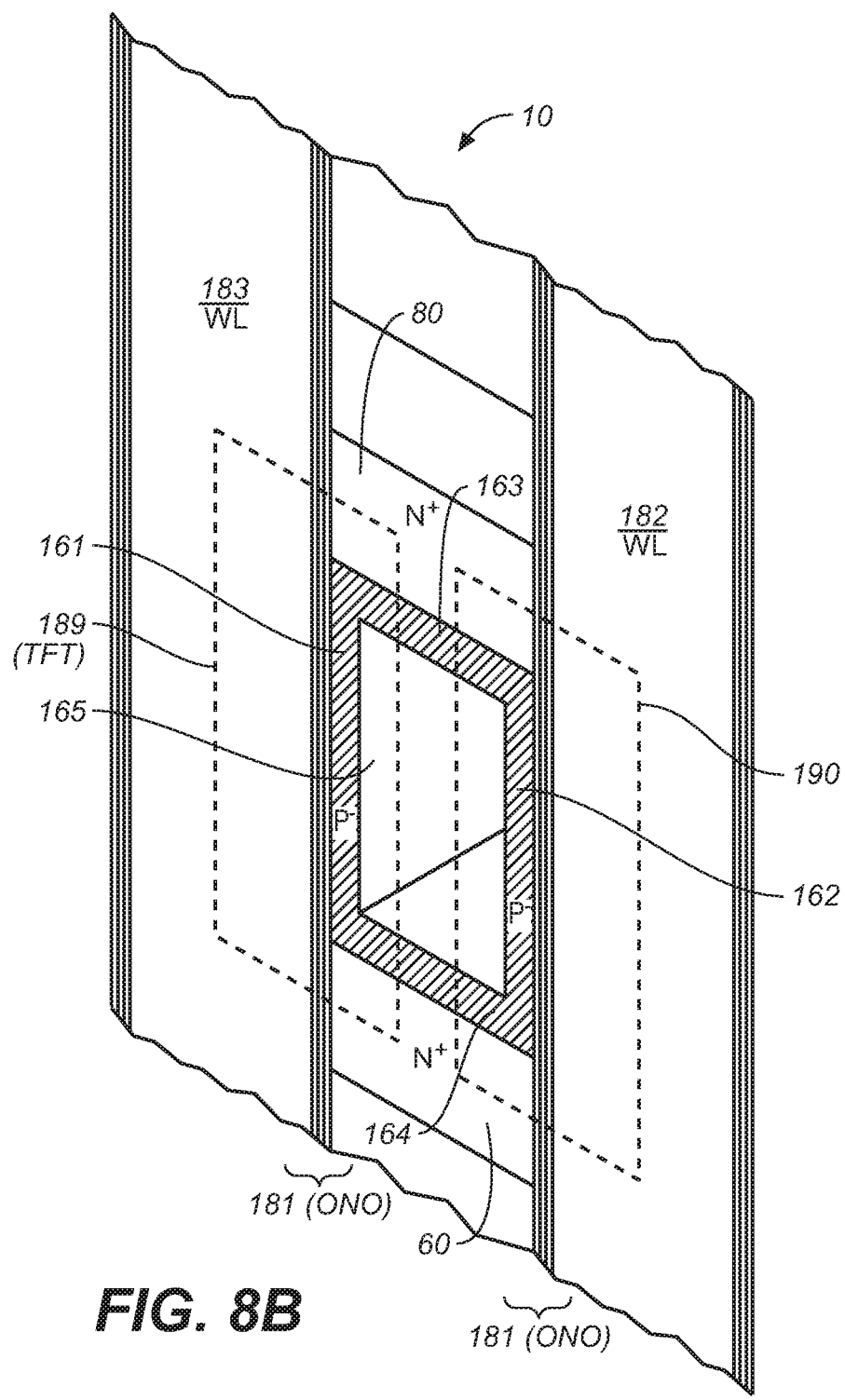
FIG. 8B shows a detailed cross-sectional view of the thin-film storage transistors on opposite sides of an active strip.

FIG. 8B shows a detailed cross-sectional view of the thin-film storage transistors on opposite sides of an active strip. As shown in FIG. 8B, dashed lines enclose area 189, which includes local word line 183 (forming a gate electrode), charge-trapping layer 181 (e.g., an ONO tri-layer), and p-doped channel region 161 in junction connections with $n^+$-doped source layer 80 and $n^+$-doped drain layer 60. Area 189 represents a thin-film a thin-film storage transistor. Area 190, which includes local word line 182, charge-trapping layer 181 (e.g., an ONO tri-layer), and p-doped channel region 162 in junction connections with n+-doped source layer 80 and n+-doped drain layer 60, similarly forms an thin-film storage transistor on the side opposite thin-film storage transistor 189 in the active strip. The processes described above, which form p-doped channel regions 161 and 162 before providing charge-trapping layer 181, are referred hereto as the "channel-first" processes, to distinguish them from the processes in alternative embodiments ("charge-trapping layer-first processes") that are described next.

Figure 9A:
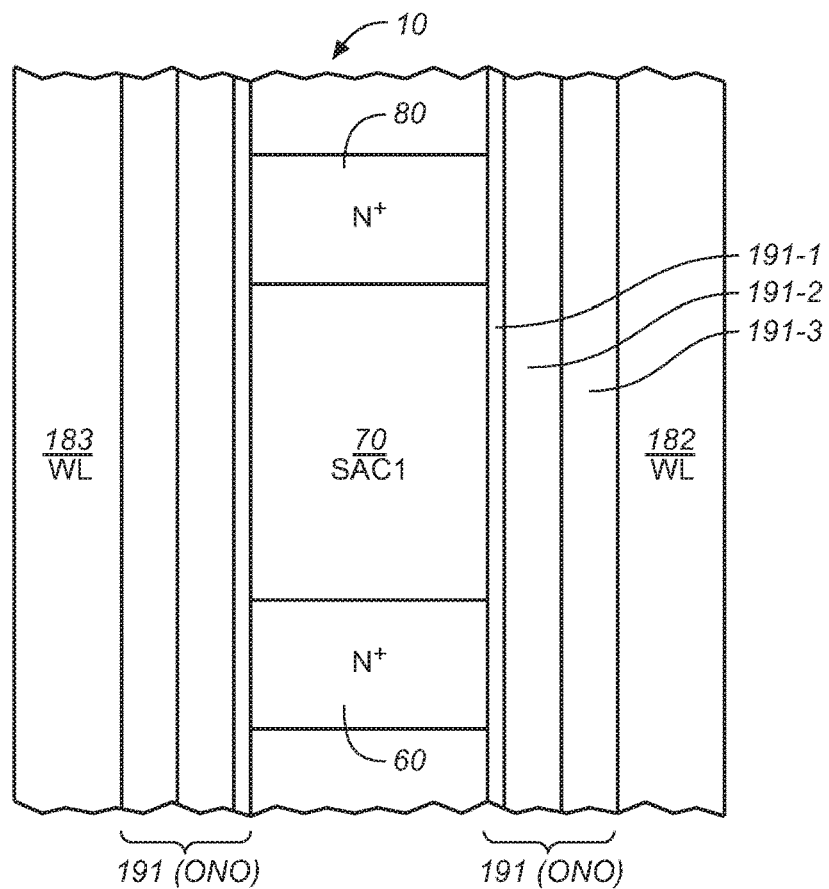
FIG. 9A is a detailed cross-sectional view showing an active strip in active stack 10, for example, after formations of charge-trapping layer 191 and local word lines 182 and 193.

In charge-trapping layer-first processes, unlike the channel-first processes described above, the thin-film storage transistors of the present invention are formed with the p-doped channel regions formed after the charge-trapping layer is formed. In these alternative processes, the charge-trapping layer and the local word liens are formed on semiconductor structure 150 of FIG. 1, before deposition of SAC-2 layer 120 (see, FIG. 2). FIG. 9A is a detailed cross-sectional view showing an active strip in active stack 10, for example, after formations of charge-trapping tri-layer 191 and local word 5 lines 182 and 183.

In the example of FIG. 9A, rather than using silicon oxide in SAC-1 layer 70, SAC-1 layer 70 may be formed using silicon germanium (SiGe), Germanium or silicon nitride, for example. Charge-trapping tri-layer 191 may include ultra-thin tunnel oxide layer 191-1, charge-trapping layer 191-2 and blocking dielectric layer 191-3. Tunnel oxide layer 191-1 may be 0.0-4.0 nm thick, in applications where programming or erase operations are achieved by direct tunneling (e.g., in QVM applications) or 4.0-7.0 nm thick, in applications where programming and erase operations are achieved by Fowler-Nordheim tunneling (e.g., in NVM applications). Charge-trapping layer 191-2 may be 2.0-7.0 nm thick, formed by a dielectric material (e.g., silicon-rich silicon nitride, nano-crystals of silicon, germanium or other nanodot materials embedded silicon nitride or silicon oxide, or another suitable charge-trapping material). Blocking dielectric layer 193-3 may be 3.0-8.0 nm thick, formed by silicon oxide, aluminum oxide, another dielectric material with a high dielectric constant, or any combination of these materials, as is known to those of ordinary skill in the art. Charge-trapping tri-layer 191 and the local word lines may be formed in substantially the same manner as described above with respect to the channel-first processes (e.g., using the processes disclosed in Non-provisional Application III).

Figure 9B:
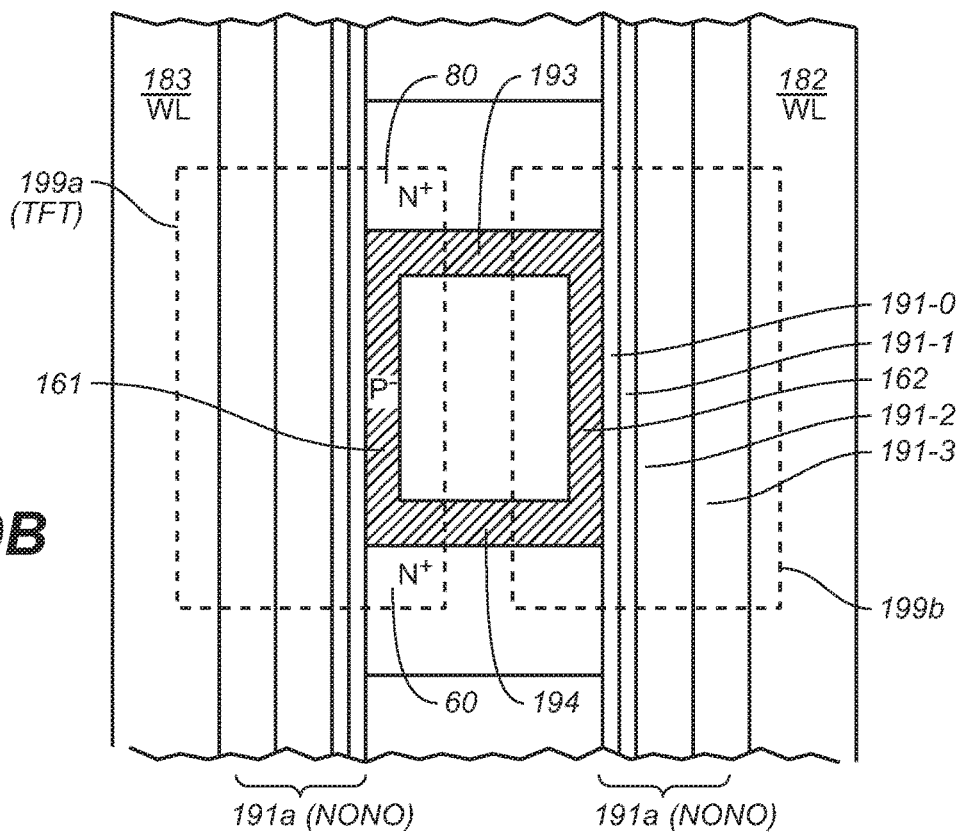
FIG. 9B is a detailed cross-sectional view showing an active strip in active stack 10, for example, after formations of charge-trapping layer 191a, local word lines 182 and 183, and p-doped channel regions 161 and 162.

Thereafter, one or more rows of shafts (e.g., row 130 of FIG. 3) may be formed after deposition of SAC-2 layer 120, using substantially the same techniques as described above with respect to FIG. 3. Adjacent rows of shafts may be spaced apart along the lengths of active stacks 10, 20, 30 and 40 at a predetermined number of local word lines. For example, openings for adjacent rows of shafts may be provided every 64, 128 or any suitable number of local word lines. As in row 130 of shafts in FIG. 3, each shaft exposes an opening at a sidewall of SAC-1 layer 70 (e.g., openings 135 of FIG. 4) of each active strip. Care must be taken to ensure that SAC-2 layer 120 fully protects the charge-trapping tri-layers (e.g., charge-trapping tri-layer 191 of FIG. 9A) during the etching steps that are carried out in the shafts. SAC-1 layer 70 may be removed by a selective etch, leaving behind in each active strip elongated hollow cavity or tunnel 140. Note that SAC-1 layer 70 is formed out of a material that has a high etch-selectivity relevant to a selected etchant, so that it may be removed by the selected etchant at an etch rate that is many times higher than the etch rate of tunnel dielectric layer 191-1, thereby preserving the integrity of tunnel dielectric layer 191-1. For NVM applications, in which tunnel dielectric layer 191-1 may be a relatively thick silicon oxide, this selective etching may be accomplished readily. However, for QVM applications, in which tunnel oxide layer 191-1 is expected to be "ultra-thin," any loss of even one or two atomic layers of this tunnel oxide during removal of the SAC-1 material by the selective etch is undesirable. To fully protect ultra-thin tunnel oxide layer 191-1 during removal of SAC-1 layer 70, rather than a charge-trapping tri-layer, a charge-trapping quad-layer may be used, such as illustrated by charge-trapping quad-layer 191a in FIG. 9B, FIG. 9B is a detailed cross-sectional view showing an active strip in active stack 10, for example, after formations of charge-trapping layer 191a, local word lines 182 and 183, and p-doped channel regions 161 and 162. In FIG. 9B, rather than having a charge trapping tri-layer (e.g., ultra-thin tunnel oxide/charge trapping nitride/blocking oxide or ONO tri-layer) formed over SAC-1 layer 70, a charge-trapping (NONO) quad-layer 191a is provided. As shown in FIG. 9B, NONO quad-layer 191a includes nitride interface layer 191-0, ultra-thin tunnel dielectric layer 191-1 (e.g., an oxynitride layer), charge trapping layer 192-2 (e.g., a silicon nitride layer), and blocking oxide layer 192-3. To form silicon nitride interface layer 191-0 and ultra-thin tunnel dielectric layer 191-1, a silicon nitride layer of 1.0-4.0 nm thick may be first deposited on the exposed smooth surface of SAC-1 layer 70. Thereafter, the deposited silicon nitride layer is partially—but not completely—oxidized. The oxidation may be carried out either at an elevated temperature (e.g., 600-800° C.) or in a plasma-assisted step at a lower temperature. The oxidation step transforms an outer portion of the silicon nitride layer into an ultra-thin oxynitride layer, which becomes tunnel dielectric layer 191-1. The unoxidized portion of the silicon nitride layer becomes silicon nitride interface layer 191-0. Ultra-thin tunnel dielectric layer 191-1 is a high-quality dielectric, with a well-controlled thickness, as oxidation of silicon nitride is a relatively slow process that can be controlled relatively precisely to provide both the high-quality tunnel dielectric film of a desirable thickness (even at less than one nanometer thick) and a consistent smooth interface between grown tunnel dielectric layer 191-1 and silicon nitride interface layer 191-0. Charge trapping layer 191-2 and blocking dielectric layer 191-3 may be formed in substantially the same manner as described above.

Removal of SAC-1 layer 70 to provide cavity 140 may be carried out in substantially the same manner as described above with respect to FIGS. 3-4. Even when silicon nitride interface layer 191-0 is as thin as a fraction of one nanometer after oxidation, it would be sufficient to protect tunnel dielectric film 191-1 during the selective etch removal of SAC-1 layer 70. Silicon nitride interface layer 191-0 may be subsequently removed through a quick isotropic nitride etch that has a high etch-selectivity to silicon oxide (e.g., a hot phosphoric etch). Alternatively, silicon nitride interface layer 191-0 may be left in place, so long as it is sufficiently thin to avoid significantly interfering with any anticipated direct-tunnel programming or erase operations to be used.

After removal of SAC-1 layer 70 and optionally, removal of silicon nitride interface layer 191-0, p-doped channel regions 161 and 162 may be formed in substantially the same manner as described above with respect to FIG. 6. The resulting active strip is shown in cross-sectional view in FIG. 9B. P-doped channel regions 193 and 194 may be 3-15 nm thick, with an in-situ dopant concentration selected to provide a relatively low 5 positive native threshold voltage (e.g., 0.5-1.5 volts). In the storage transistors 199a and 199b of FIG. 9B, channel regions 161 and 162 are readily depleted when their respective word line voltages are at 0 volts, thus minimizing any subthreshold leakage current between source layer 90 and drain layer 60.

Among the advantages of the charge-trapping layer first processes are: a) the charge-trapping quad-layer 191a may be formed and thermally annealed using at a higher temperature, without concern for thermal diffusion of the $n^+$ dopant from source layer 80 or drain layer 60 into the channel regions (as channel regions 161 and 162 are not yet in place); b) the interface between p-doped channel region (e.g., p-doped channel regions 161 and 162) and silicon nitride interface layer 191-0 is smooth and substantially void of any native oxide layer, thereby reducing the presence of interface states, and facilitating tight threshold voltage and channel mobility distributions across active strips in an active stack, as well as between active strips across active stacks on the same die or wafer.

The above detailed description is provided to illustrate specific embodiments of the present invention and is not intended to be limiting. Numerous modifications and variations within the scope of the present invention are possible. The present invention is set forth in the following claims.

We claim:

1. A process for fabricating a HNOR device, comprising:
   forming a plurality of active stacks of semiconductor material over a planar surface of a semiconductor substrate, the plurality of active stacks being spaced apart from each other along a first direction substantially parallel to the planar surface, wherein each active stack (i) extends lengthwise along a second direction that is substantially parallel to the planar surface and substantially orthogonal to the first direction, and (ii) comprises one or more active strips, and wherein each active strip (i) also extends lengthwise along the second direction, and (ii) comprises: (a) first and second semiconductor layers of a first conductivity; and (b) a sacrificial layer between the first and the second semiconductor layers;
   providing a protective layer over the plurality of active stacks;
   forming a plurality of shafts through the protective layer, each shaft being provided between adjacent active stacks and exposing a sidewall of each active strip of at least one of the adjacent active stacks;
   providing an etchant to selectively remove the sacrificial layer from each active strip, proceeding from the exposed sidewall of the active strip until the sacrificial layer of the active strip is substantially removed, thereby resulting in a cavity in place of the sacrificial layer;
   conformally depositing a third semiconductor layer, the third semiconductor layer being of a second conductivity type opposite the first conductivity type, such that first portion and a second portion of the third semiconductor layer abut the first and the second semiconductor layers, respectively; and
   removing the third semiconductor layer from exposed sidewalls of each shaft, without substantially removing the third semiconductor layer in the active strip;
   annealing the third semiconductor layer thermally to re-crystallize the third semiconductor layer and to cause dopants in the first and the second semiconductor layers to diffuse into the first and the second portions of the third semiconductor layer of the active strip sufficiently to change the first and the second portions of the third semiconductor layer from the second conductivity type to the first conductivity type.

2. The process of claim 1, further comprising, prior to providing the protective layer, forming (i) a charge-trapping multi-layer over sidewalls of the plurality of active stacks, and (ii) local word lines each provided between adjacent active stacks, each word line abutting the charge-trapping multi-layers of the adjacent active stacks.

3. The process of claim 2, wherein forming the charge-trapping multi-layer comprises forming (i) a tunnel dielectric layer; (ii) a charge-trapping layer; and (iii) a blocking dielectric layer.

4. The process of claim 3, wherein forming the tunnel dielectric layer comprises (i) depositing a silicon nitride layer over the sidewalls of each active stack; and (ii) oxidizing the silicon nitride layer such that a portion of silicon nitride layer becomes a silicon oxynitride layer.

5. The process of claim 4, further comprising, prior to depositing the third semiconductor layer, removing any unoxidized portions of the silicon nitride layer.

6. The process of claim 4, wherein conformally depositing the third semiconductor layer results in a third portion and a fourth portion of the third semiconductor layer each abutting the tunnel dielectric layers on opposite sidewalls of the active stack.

7. The process of claim 6, wherein each local word line, the charge-storing multi-layer abutting that word line, the third or the fourth portion of the third semiconductor layer abutting the tunnel dielectric layer of that charge-storing multi-layer and the third and the fourth portions of the semiconductor layers form, respectively, a gate electrode, a storage layer, a channel region and source and drain regions of a thin-film storage transistor.

8. The process of claim 7, wherein adjacent thin-film storage transistors along one side of an active strip form a NOR-type memory string.

9. The process of claim 7, wherein the thin-film storage transistor has the channel region substantially depleted when the word line abutting the channel region is biased to 0 volts.

10. The process of claim 3, wherein the charge-trapping layer comprises a material selected from one or more of silicon-rich silicon nitride, nano-crystals of silicon, germanium and a nanodot material embedded silicon nitride or silicon oxide.

11. The process of claim 3, wherein the tunnel dielectric layer is 0.0-4.0 nm thick.

12. The process of claim 3, wherein the tunnel dielectric layer is 4.0-7.0 nm thick.

13. The process of claim 2, wherein the charge-trapping multi-layer is 1.0-8.0 nm thick.

14. The process of claim 1, further comprising, subsequent to conformally depositing the third semiconductor layer, (a) removing the protective layer, and (b) forming (i) a charge-trapping multi-layer over sidewalls of the plurality of active stacks, and (ii) local word lines each provided between adjacent active stacks, each word line abutting the charge-trapping multi-layers of the adjacent active stacks.

15. The process of claim 14, wherein forming the charge-trapping multi-layer comprises forming at least (i) a tunnel dielectric layer; (ii) a charge-trapping layer; and (iii) a blocking dielectric layer.

16. The process of claim 15, wherein providing the protective layer comprises depositing conformal silicon nitride layers over the sidewalls of the active stacks, and depositing a polysilicon layer, such that the subsequent conformal deposition of the third semiconductor layer results in a third portion and a fourth portion of the third semiconductor layer abutting the conformal silicon nitride layers on opposite sidewalls of the active stack.

17. The process of claim 16, wherein each local word line, the charge-trapping layer abutting the word line, the third portion or the fourth portion of the third semiconductor layer abutting the tunnel dielectric layer of that charge-trapping multi-layer and the third and fourth semiconductor layers form, respectively, a gate electrode, a storage layer, a channel region and source and drain regions of a thin-film storage transistor.

18. The process of claim 17, wherein adjacent thin-film storage transistors along one side of an active strip form a NOR-type memory string.

19. The process of claim 17, wherein the thin-film storage transistor has the channel region substantially depleted when the word line is biased to 0 volts.

20. The process of claim 16, wherein the charge-trapping layer comprises a material selected from one or more of silicon-rich silicon nitride, nano-crystals of silicon, germanium and a nanodot material embedded silicon nitride or silicon oxide.

21. The process of claim 16, wherein the tunnel dielectric layer is 0.0-4.0 nm thick.

22. The process of claim 16, wherein the tunnel dielectric layer is 4.0-7.0 nm thick.

23. The process of claim 16, wherein the charge-trapping multi-layer is 1.0-8.0 nm thick.

24. The process of claim 15, wherein the charge-trapping multi-layer is 1.0-8.0 nm thick.

25. The process of claim 1, wherein at least one of the first, the second and the third semiconductor layers have as dopants one of: phosphorus, arsenic, antimony and bismuth.

26. The process of claim 1, further comprising forming in each active strip, first and second metal layers that abut the first and the second semiconductor layers, respectively.

27. The process of claim 1, further comprising providing a dielectric material within a space surrounded by the third semiconductor layer as isolation between a third portion and a fourth portion of the third semiconductor layer.

28. The process of claim 1, wherein a space surrounded by the third semiconductor layer form an air gap between a third portion and a fourth portion of the third semiconductor layer.

29. The process of claim 1, wherein the third semiconductor layer within the active strip does not fill the cavity.

30. The process of claim 1, wherein the sacrificial material comprises silicon oxide.

31. The process of claim 1, wherein the sacrificial material comprises silicon germanium.

\* \* \* \* \*